(12) United States Patent
Tabaru et al.

(10) Patent No.: US 6,452,277 B1
(45) Date of Patent: Sep. 17, 2002

(54) SEMICONDUCTOR DEVICE AND MANUFACTURING METHOD THEREOF

(75) Inventors: Kenji Tabaru; Kazunori Yoshikawa; Takahiro Yokoi; Akemi Teratani, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/551,840

(22) Filed: Apr. 18, 2000

(30) Foreign Application Priority Data

Oct. 22, 1999 (JP) .......................... 11-300681

(51) Int. Cl.[7] .................. H01L 23/48; H01L 23/52; H01L 29/40
(52) U.S. Cl. ................. 257/774; 257/773; 257/734; 257/750; 257/751; 257/758
(58) Field of Search ................. 257/774, 773, 257/734, 750, 751, 758

(56) References Cited

U.S. PATENT DOCUMENTS

| | | | | |
|---|---|---|---|---|
| 3,617,818 A | * | 11/1971 | Fuller ......................... | 257/763 |
| 4,005,455 A | * | 1/1977 | Watrous, Jr. et al. ....... | 257/774 |
| 4,801,559 A | * | 1/1989 | Imaoka ...................... | 438/629 |
| 5,036,383 A | * | 7/1991 | Mori ........................... | 257/751 |
| 5,502,337 A | * | 3/1996 | Nozaki ....................... | 257/773 |
| 5,700,735 A | * | 12/1997 | Shiue et al. ................ | 438/612 |
| 5,734,200 A | * | 3/1998 | Hsue et al. ................. | 257/755 |
| 6,051,879 A | * | 4/2000 | Jiang .......................... | 257/751 |
| 6,140,701 A | * | 10/2000 | Raina et al. ................ | 257/734 |
| 6,163,075 A | * | 12/2000 | Okushima ................... | 357/759 |
| 6,177,707 B1 | * | 1/2001 | Dekker et al. ............. | 257/347 |
| 6,211,568 B1 | * | 4/2001 | Hong .......................... | 257/754 |
| 6,300,688 B1 | * | 10/2001 | Wong ......................... | 257/786 |

FOREIGN PATENT DOCUMENTS

| | | | |
|---|---|---|---|
| EP | 000038248 A1 | * | 10/1981 |
| EP | 0315980 A2 | * | 5/1989 |
| EP | 0395072 A2 | * | 10/1990 |
| JP | 405267608 A | * | 10/1993 |
| JP | 405283685 A | * | 10/1993 |
| JP | 7-94448 | | 4/1995 |

* cited by examiner

Primary Examiner—Caridad Everhart
Assistant Examiner—Chuong Luu
(74) Attorney, Agent, or Firm—McDermott, Will & Emery

(57) ABSTRACT

A silicon oxide film is formed to cover a polysilicon plug. A bowing shaped hole is formed. A barrier metal and a metal film are formed, which are successively subjected to prescribed anisotropic etching. Here, because of the RIE-lag effect, the etch rate of the barrier metal becomes smaller in the portion between the side surface of the hole and the metal film than in the other portions, preventing the exposure of the surface of the polysilicon plug. Thus, a semiconductor device ensuring a good electrical connection of metal interconnections is obtained.

6 Claims, 18 Drawing Sheets

SEMICONDUCTOR DEVICE AND MANUFACTURING METHOD THEREOF

BACKGROUND OF THE INVENTION

1. Field of the Invention

The present invention relates to semiconductor devices and manufacturing methods thereof, and more particularly, to a manufacturing method of a semiconductor device which ensures a good electrical connection of metal interconnections, and a semiconductor device obtained by the mentioned manufacturing method.

2. Description of the Background Art

In recent years, as semiconductor devices represented by ULSIs have become more integrated and more powerful, complexity and density of structures especially interposed in the vertical direction between metal interconnections have been increasing. A conventional method of manufacturing a semiconductor device having metal interconnections will now be described by way of example.

Referring first to FIG. 32, a polycrystalline silicon (hereinafter, referred to as "polysilicon") plug 104 is formed on a semiconductor substrate (not shown). A silicon oxide film 103 is formed on the semiconductor substrate to cover polysilicon plug 104. A prescribed photo resist pattern (not shown) is formed on silicon oxide film 103.

Using the photo resist pattern as a mask, silicon oxide film 103 is subjected to anisotropic etching to form a contact hole 105 exposing the surface of polysilicon plug 104. The photo resist pattern is then removed.

Next, a barrier metal 106 including a titanium nitride film is formed by sputtering. At this time, barrier metal 106 formed on the upper surface of silicon oxide film 103 and on the side and bottom surfaces of contact hole 105 has approximately the same film thickness ti.

Next, a metal film 107 including tungsten is formed by sputtering or the like to cover barrier metal 106. A prescribed photo resist pattern 132 is formed on metal film 107.

Referring next to FIG. 33, metal film 107 is subjected to anisotropic etching using photo resist pattern 132 as a mask, to expose the surface of barrier metal 106 located on the upper surface of silicon oxide film 103.

Referring next to FIG. 34, the exposed barrier metal 106 is further anisotropically etched using photo resist pattern 132 as a mask, so that the upper surface of silicon oxide film 103 is exposed. Thereafter, photo resist pattern 132 is removed. A metal interconnection 107a is thus formed from metal film 107.

Next, an interlayer insulating film (not shown) is further formed on silicon oxide film 103 to cover metal interconnection 107a. Accordingly, a main portion of the semiconductor device having the metal interconnection is completed.

The above-described method of manufacturing a semiconductor device, however, exhibits the following problems. At the step shown in FIG. 34, after the etching of barrier metal 106 for the film thickness ti, over-etching is conducted such that no etch residue of barrier metal 106 is left on the upper surface of silicon oxide film 103.

This over-etching may cause barrier metal 106 located on the side surface of contact hole 105 to be etched away, which leads to exposure of the surface of polysilicon plug 104. Thereafter, the semiconductor substrate is processed with HCl or NH$_4$OH to remove metal contamination or dust particles thereon.

At this time, if the cleaning with NH$_4$OH is performed with the surface of polysilicon plug 104 being exposed, isotropic etching will proceed from the exposed portion of polysilicon plug 104 as shown in FIG. 35, so that a concave portion 120 is formed. If the interlayer insulating film (not shown) is formed in this situation, the concave portion 120 will become a void.

This void may cause an unstable electrical connection between metal interconnection 107a, barrier metal 106 and polysilicon plug 104. Further, metal interconnection 107a and barrier metal 106 may be disconnected from polysilicon plug 104. As a result, the operation of the semiconductor device would become unstable, hindering a desired operation.

SUMMARY OF THE INVENTION

The present invention is directed to solve the above problems. One object of the present invention is to provide a manufacturing method of a semiconductor device having metal interconnections ensuring a stable electrical connection. Another object of the present invention is to provide a semiconductor device obtained by such a manufacturing method.

A manufacturing method of a semiconductor device according to a first aspect of the present invention includes the following steps: the step of forming a conductive region on a semiconductor substrate; the step of forming an insulating film on the semiconductor substrate to cover the conductive region; the step of forming a hole in the insulating film to expose a surface of the conductive region; the step of forming a conductive layer in the hole, that is electrically connected to the conductive region exposed at the bottom of the hole; and the step of forming a conductive portion by etching the conductive layer. At the step of forming the conductive portion, an etch rate of the conductive layer is set smaller at least in the vicinity of the side surface of the open end of the hole than in the other portion, to prevent the exposure of the surface of the conductive region at the bottom of the hole.

According to this manufacturing method, at the step of forming the conductive portion, the exposure of the surface of the conductive region at the bottom of the hole is prevented particularly taking advantage of an RIE-lag effect. Thus, even if processing with NH$_4$OH is conducted in a later step for removal of metal contamination or dust particles on the semiconductor substrate, the conductive region is prevented from being etched. As a result, it is possible to accomplish a semiconductor device in which a good electrical connection between the conductive portion and the conductive region is ensured. The RIE-lag effect will be described below in conjunction with embodiments of the present invention.

Preferably, the step of forming the conductive layer includes: the step of forming a first conductive layer having a film thickness smaller on the side surface of the hole than on the upper surface of the insulating film or on the bottom surface of the hole; and the step of forming a second conductive layer having an etch characteristic different from that of the first conductive layer, to cover the first conductive layer. The step of forming the conductive portion preferably includes: the step of forming a mask material, on the second conductive layer, having a diameter smaller than the aperture of the hole at its open end; the step of anisotropically etching the second conductive layer using the mask material as a mask, to expose the surface of the first conductive layer located on the upper surface of the insulating film; and the step of further anisotropically etching the exposed first conductive layer using the mask material as a mask, to remove the first conductive layer located on the upper surface of the insulating film and the first conductive layer located between the side surface of the hole and the second conductive layer.

In this case, when the first conductive layer located between the side surface of the hole and the second conductive layer is subjected to etching, the first conductive layer formed on the side surface of the hole is thinner than the first conductive layer formed in the other portions. This prevents sufficient etchant from entering the narrow portion as the etching proceeds, so that the etch rate of the first conductive layer in this portion becomes smaller than that in the other portions. Accordingly, at the time of anisotropic etching of the first conductive layer, it is possible to reliably prevent the exposure of the conductive region even if over-etching is conducted.

Preferably, the step of forming the hole includes the step of shaping the hole such that the hole has a bowing or upwardly tapering cross section.

In this case, the first conductive layer can readily be formed by sputtering, for example, to have a film thickness smaller on the side surface of the hole than in the other portion.

Preferably, the step of forming the hole includes the step of setting an aspect ratio of the hole to at least 0.75.

Again in this case, the first conductive layer can readily be formed by sputtering, for example, with a film thickness smaller on the side surface of the hole than in the other portion.

The manufacturing method of the semiconductor device according to a second aspect of the present invention includes: the step of forming a conductive region on a semiconductor substrate; the step of forming an insulating film on the semiconductor substrate to cover the conductive region; the step of forming a hole in the insulating film to expose the surface of the conductive region; the step of forming a conductive layer in the hole, that is electrically connected to the conductive region exposed at the bottom of the hole; the step of forming a conductive portion by etching the conductive layer to remove a portion of the conductive layer in the vicinity of the side surface of the hole from its open end down to its bottom; and the step of forming an etch stopper layer having an etch characteristic different from that of the conductive region, in a region at the bottom of the hole between the conductive portion and the side surface of the hole that is at least exposed by removing the conductive layer at the step of forming the conductive portion.

According to the manufacturing method as described above, when etching the conductive layer at the step of forming the conductive portion, even if the bottom of the hole is exposed by over-etching, there exists the etch stopper film at the exposed portion. Thus, even if a processing with NH$_4$OH is performed in a later step for removal of metal contamination or dust particles on the semiconductor substrate, the etch stopper film protects the conductive region, preventing the conductive region from being etched. As a result, a semiconductor device ensuring an electrical connection between the conductive portion and the conductive region is accomplished.

In the case where the conductive region includes a polysilicon film, a metal silicide layer is preferably formed as the etch stopper film, by causing the silicon within the conductive region to react with metal.

Alternatively, a silicon oxide film may be formed as the etch stopper film by oxidizing the silicon on the surface of the conductive region exposed after the formation of the conductive portion.

For the oxidization of the silicon in the conductive region, the exposed surface of the conductive region is preferably brought in plasma atmosphere including oxygen.

The manufacturing method of a semiconductor device according to the third aspect of the present invention includes the following steps: the step of forming a conductive region on a semiconductor substrate; the step of forming an insulating film on the semiconductor substrate to cover the conductive region; the step of forming a hole in the insulating film to expose the surface of the conductive region; the step of forming a conductive layer in the hole, that is electrically connected to the conductive region exposed at the bottom of the hole; and the step of forming a conductive portion by etching the conductive layer. The step of forming the conductive layer includes: the step of forming a first conductive layer; and the step of forming, on the first conductive layer, a second conductive layer having an etch characteristic different from the etch characteristic of the first conductive layer. The step of forming the conductive portion includes: the step of forming a resist pattern on the second conductive layer to entirely cover the open end of the hole; and the step of anisotropically etching the second and the first conductive layers using the resist pattern as a mask.

According to the manufacturing method as described above, the resist pattern for the formation of the conductive portion covers the entire open end of the hole. Thus, during the etching of the second and first conductive layers, the layers located in the hole are not etched away, hindering the exposure of the bottom of the hole. Therefore, even if a processing with NH$_4$OH is performed in a later step for removal of metal contamination or dust particles on the semiconductor substrate, the conductive region is prevented from being etched. As a result, a semiconductor device ensuring an electrical connection between the conductive portion and the conductive region is achieved.

The semiconductor device according to the fourth aspect of the present invention includes: a semiconductor substrate, a conductive region, an insulating film, a hole, and a conductive portion. The semiconductor substrate has a main surface. The conductive region is formed on the semiconductor substrate. The insulating film is formed on the semiconductor substrate to cover the conductive region. The hole is formed in the insulating film, exposing the surface of the conductive region. The conductive portion is formed in the hole, and electrically connected to the conductive region exposed at the bottom of the hole. The conductive portion has a portion spaced apart from the side surface of the hole at least in the vicinity of the open end of the hole.

This semiconductor device is obtained by the manufacturing method of a semiconductor device according to the first aspect of the present invention. During the formation of the conductive portion, the conductive layer in the vicinity of the side surface of the hole is being etched. As the etching proceeds, however, the RIE-lag effect prevents the etchant from entering the etched portion, thereby avoiding the exposure of the conductive region located at the bottom of the hole. Accordingly, the conductive layer is etched in the vicinity of the open end of the hole, where the side surface of the hole is exposed. The conductive portion thus has a portion spaced apart from the side surface of the hole.

The hole preferably has its open end narrower than its inner opening portion. Specifically, it is further preferred that the hole has a bowing or upwardly tapering cross section.

As explained above, a prescribed conductive layer constituting the conductive portion can readily be formed to have a film thickness smaller on the side surface of the hole than on the bottom surface of the hole or on the upper surface of the insulating film.

Preferably, the conductive portion has a portion spaced apart from the side surface of the hole from the open end of the hole along the side surface of the hole. Further, it is preferred that a prescribed layer having an etch characteristic different from that of the conductive region is formed at the bottom surface of the hole located between the conductive portion and the side surface of the hole.

This semiconductor device is obtained by the manufacturing method of a semiconductor device according to the second aspect of the present invention. The prescribed layer having the etch characteristic different from that of the conductive region is formed at the bottom of the hole, at least at a portion where the conductive region is exposed when forming the conductive portion. This prescribed layer protects the conductive region, preventing the conductive region from being etched during the processing with $NH_4OH$ in a later step.

The conductive region preferably includes a polysilicon film. The prescribed layer preferably includes a metal silicide layer, or it may include a silicon oxide film.

The semiconductor device according to the fifth aspect of the present invention includes: a semiconductor substrate, a conductive region, an insulating film, a hole, and a conductive portion. The semiconductor substrate has a main surface. The conductive region is formed on the semiconductor substrate. The insulating film is formed on the semiconductor substrate to cover the conductive region. The hole is formed in the insulating film to expose the surface of the conductive region. The conductive portion is formed in the hole, and electrically connected to the conductive region exposed at the bottom of the hole. The conductive portion has a first conductive layer and a second conductive layer, formed on the first conductive layer, having an etch characteristic different from that of the first conductive layer. The second conductive layer is formed to entirely cover the open end of the hole.

This semiconductor device is obtained by the manufacturing method according to the third aspect of the present invention. The resist pattern for the formation of the conductive portion is formed to cover the entire open end of the hole, so that the second conductive layer being etched using the resist pattern as a mask entirely covers the open end of the hole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
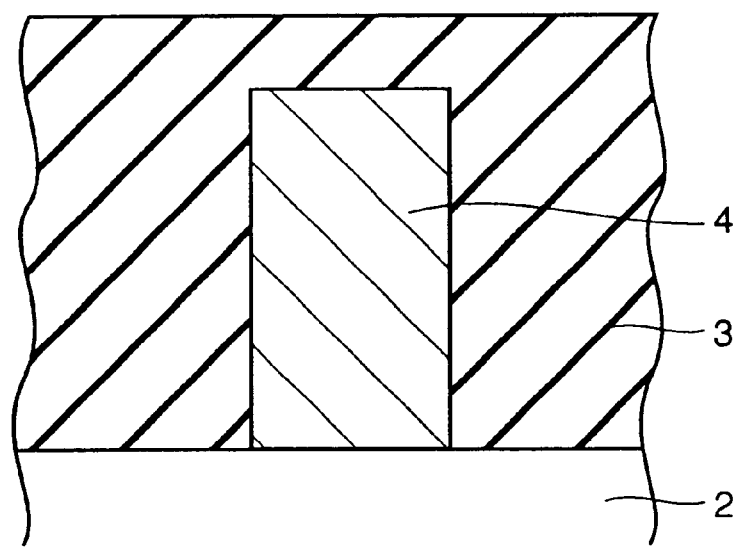
FIGS. 1 to 4 are cross sectional views illustrating successive steps of the manufacturing method of a semiconductor device according to a first embodiment of the present invention.

The manufacturing method of a semiconductor device according to the first embodiment of the present invention and the semiconductor device obtained by the manufacturing method will now be described with reference to the drawings. Referring first to FIG. 1, a polysilicon plug 4 is formed on a silicon substrate 2. A silicon oxide film 3 is formed on silicon substrate 2 to cover polysilicon plug 4 by CVD, for example.

Figure 2:
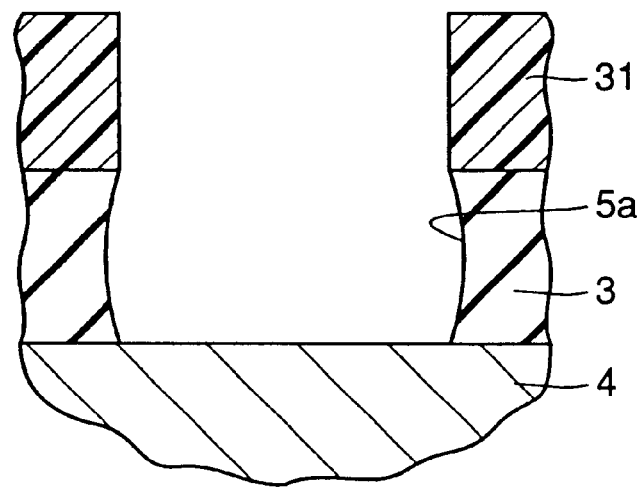

Next, referring to FIG. 2, a resist pattern 31 is formed on silicon oxide film 3. Next, using a parallel plate reactive ion etching (RIE) system, for example, silicon oxide film 3 is subjected to anisotropic etching using resist pattern 31 as a mask, under the conditions of: $C_4F_8$ flow rate of 0.01 L/min (10 sccm); CO flow rate of 0.05 L/min (50 sccm); $O_2$ flow rate of 0.05 L/min (50 sccm); Ar flow rate of 0.15 L/min (150 sccm); pressure of 1.995 Pa (15 mTorr); RF power of 140 W; and electrode temperature of −10° C., so that a bowing shaped hole 5a is formed. The electrode is cooled, for example, with liquid chlorofluorocarbon.

The bowing shaped hole 5a has its open end narrower than its inner opening portion. Such a hole with a bowing shape tends to be created when silicon oxide film 3 is being etched in plasma atmosphere including a relatively large amount of radical components contributing to the etching so that the etching proceeds isotropically. The bowing shaped hole also tends to be formed when the plasma atmosphere includes a fewer amount of radical components contributing to the formation of a reactively produced film on the side surface of silicon oxide film 3.

For this etching, an electron cyclotron resonance (ECR) type etching system may also be used instead of the parallel plate RIE system, and mixed gases such as $CHF_3/CF_4/Ar$ and $C_4F_8/O_2$ may also be used.

Figure 3:
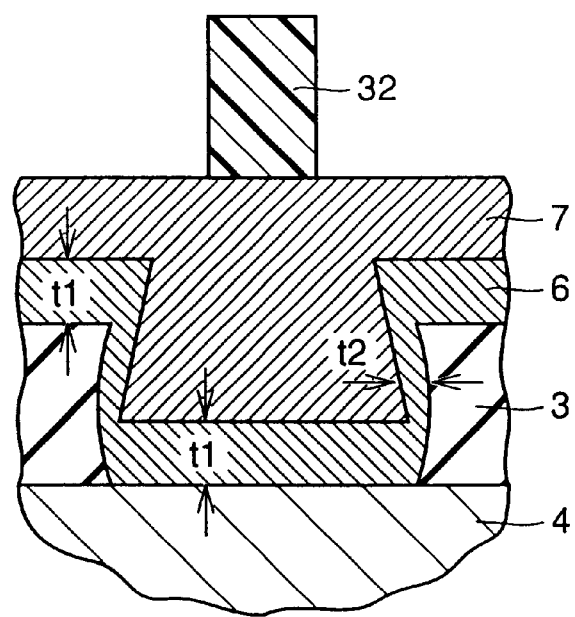

Next, referring to FIG. 3, a barrier metal 6 is formed on silicon oxide film 3 to cover the side and bottom surfaces of hole 5a, by sequentially depositing a titanium (Ti) film of about 10 nm thick and a titanium nitride (TiN) film of about 70 nm thick by sputtering or CVD.

At this time, barrier metal 6 becomes thinner on the side surface of hole 5a than on the bottom surface of hole 5a or on the upper surface of silicon oxide film 3 due to the bowing shape of hole 5a. In the present embodiment, assuming that barrier metal 6 has a film thickness $t_1$ of about 80 nm on the upper surface of silicon oxide film 3 and on the bottom surface of hole 5a, it has a film thickness $t_2$ of about 20 nm on the side surface of hole 5a.

Next, a metal film 7 including tungsten (W) of about 100 nm thick is formed on barrier metal 6 by sputtering or CVD. A resist pattern 32 is formed on metal film 7, which will become an interconnection layer. This resist pattern 32 has a width smaller than the aperture of hole 5a.

Figure 4:
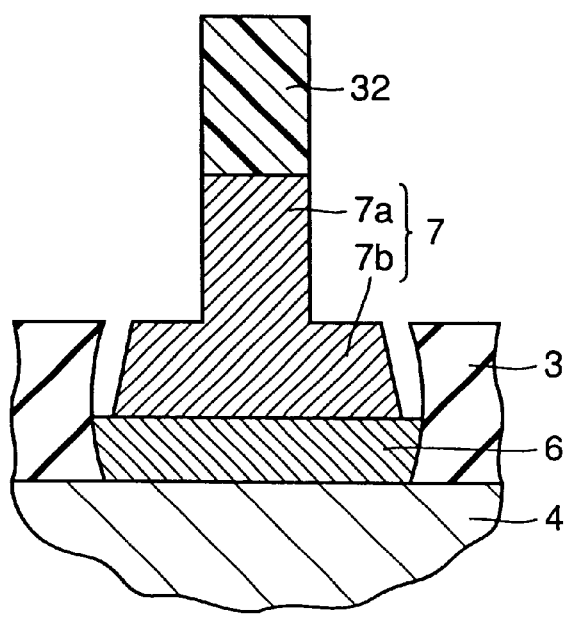

Referring next to FIG. 4, using an inductively coupled plasma (ICP) etching system, for example, metal film 7 is subjected to anisotropic etching with resist pattern 32 as a mask, under the conditions of: $SF_6$ flow rate of 0.09 L/min (90 sccm); $CF_4$ flow rate of 0.02 L/min (20 sccm); $N_2$ flow rate of 0.01 L/min (10 sccm); pressure of 1.995 Pa (15 mTorr); RF power of 40 W; and electrode temperature of 20° C., hereinafter referred to as "Condition A". Thus, barrier metal 6 located on the upper surface of silicon oxide film 3 is exposed.

Subsequently, barrier metal 6 is subjected to anisotropic etching under the conditions of: $Cl_2$ flow rate of 0.08 L/min (80 sccm); $BCl_3$ flow rate of 0.02 L/min (20 sccm); $CF_4$ flow rate of 0.02 L/min (20 sccm); pressure of 1.995 Pa (15 mTorr); RF power of 60 W; and electrode temperature of 20° C., hereinafter referred to as "Condition B". The upper surface of silicon oxide film 3 is thus exposed.

At this time, over-etching is conducted such that no residue of barrier metal 6 will remain on the surface of silicon oxide film 3. During this over-etching, barrier metal 6 located between silicon oxide film 3 and metal film 7 in the vicinity of the open end of hole 5a is etched away.

Besides the ICP etching system, an ECL etching system may also be employed. Further, $SF_6$ gas or mixed gas of $SF_6/CF_4$ may be used for the etching of metal film 7. For the etching of barrier metal 6, $Cl_2$ gas, mixed gases of $Cl_2/Ar$ and of $Cl_2/BCl_3$ may also be employed.

Figure 5:
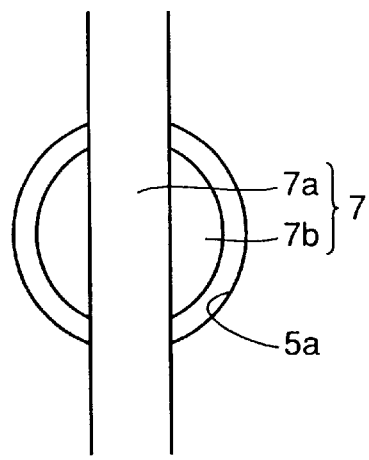
FIG. 5 is a top plan view illustrating the structure at the step shown in FIG. 4.
Figure 6:
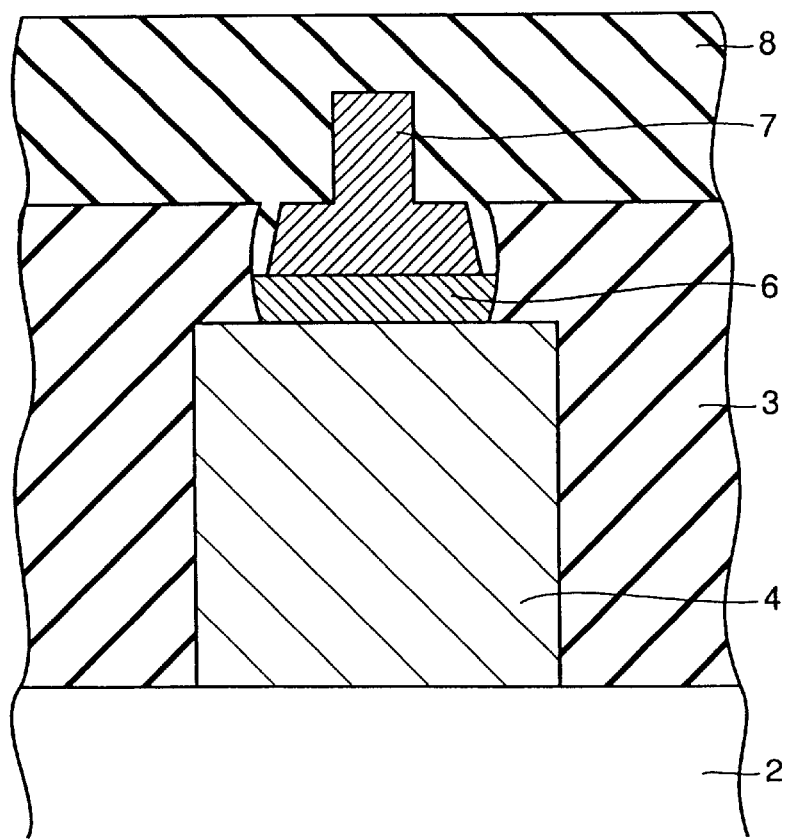
FIG. 6 is a cross sectional view illustrating a step following the step shown in FIG. 4.

Thereafter, resist pattern 32 is removed. Thus, a metal interconnection 7a and a buried portion 7b are formed as shown in FIG. 5. Next, referring to FIG. 6, a silicon oxide film 8 to be an interlayer insulating film is formed on silicon oxide film 3 to cover the metal film. Thus, a main portion of the semiconductor device including metal interconnection is completed.

In the manufacturing method described above, at the step shown in FIG. 4, over-etching is performed to remove the residue of barrier metal 6. During this over-etching, barrier metal 6 located between the side surface of hole 5a and metal film 7 is etched as explained above.

Specifically, the film thickness $t_2$ of barrier metal 6 formed on the side surface of hole 5a is smaller than the film thickness $t_1$ of barrier metal 6 formed on the bottom surface of hole 5a and on the upper surface of silicon oxide film 3. Therefore, a narrow groove is created where barrier metal 6 is etched away in the vicinity of the open end of hole 5a, and such narrowness prevents sufficient etchant from entering the groove in the course of etching.

As a result, the etch rate of barrier metal 6 located in the vicinity of the side surface of hole 5a is reduced as compared to that of barrier metal 6 located on silicon oxide film 3.

Such a phenomenon is especially called an "RIE-lag effect." This RIE-lag effect is more significant as the width of the groove becomes narrower; i.e., as the film thickness of barrier metal 6 located on the side surface of hole 5a becomes thinner.

As explained above, the RIE-lag effect decreases the etch rate of barrier metal 6 located on the side surface of hole 5a during the over-etching, preventing the exposure of the surface of polysilicon plug 4 located at the bottom of hole 5a.

Thus, even if a processing with $NH_4OH$ is performed in a later step for removal of metal contamination or dust particles on silicon substrate 2, barrier metal 6 protects polysilicon plug 4, hindering simultaneous etching of the surface of polysilicon plug 4. As a result, a semiconductor device ensuring an electrical connection between metal interconnection 7a and polysilicon plug 4 via buried portion 7b and barrier metal 6 is achieved.

Second Embodiment

Figure 7:
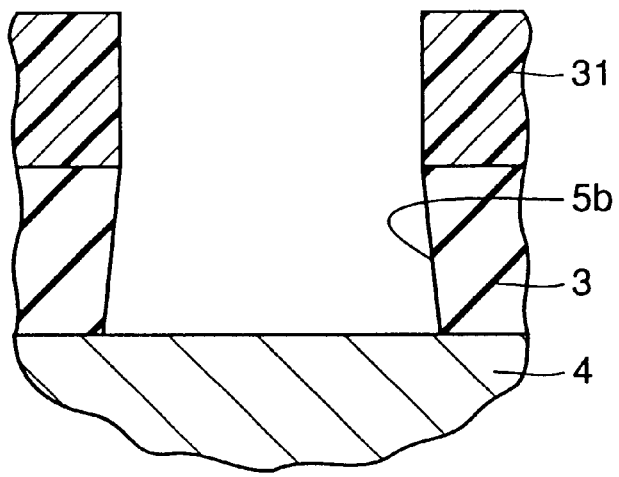
FIGS. 7 to 10 are cross sectional views illustrating successive steps of the manufacturing method of a semiconductor device according to a second embodiment of the present invention.

The manufacturing method of a semiconductor device according to the second embodiment of the present invention and the semiconductor device obtained by the manufacturing method will now be described with reference to the drawings. First, after the step shown in FIG. 1, a resist pattern 31 is formed on silicon oxide film 3. Next, referring to FIG. 7, using a parallel plate RIE system, silicon oxide film 3 is anisotropically etched with resist pattern 31 as a mask, under the conditions of: $C_4F_8$ flow rate of 0.01 L/min (10 sccm); CO flow rate of 0.05 L/min (50 sccm); $O_2$ flow rate of 0.1 L/min (100 sccm); Ar flow rate of 0.15 L/min (150 sccm); pressure of 1.995 Pa (15 mTorr); RF power of 100 W; and electrode temperature of −10° C. Thus, a hole 5b tapered toward the top is formed.

This hole 5b has an opening portion that becomes wider from its open end towards its bottom. Such an upwardly tapering hole tends to be formed if radical components in the plasma atmosphere contributing to etching reflect at the bottom of the hole, thereby etching the side surface in the bottom of the hole.

Here, an ECR type etching system may be used instead of the parallel plate type RIE system. Further, mixed gases such as $CHF_3/CF_4/Ar$ and $CF_4/O_2/Ar$ may be employed for the etching.

Figure 8:
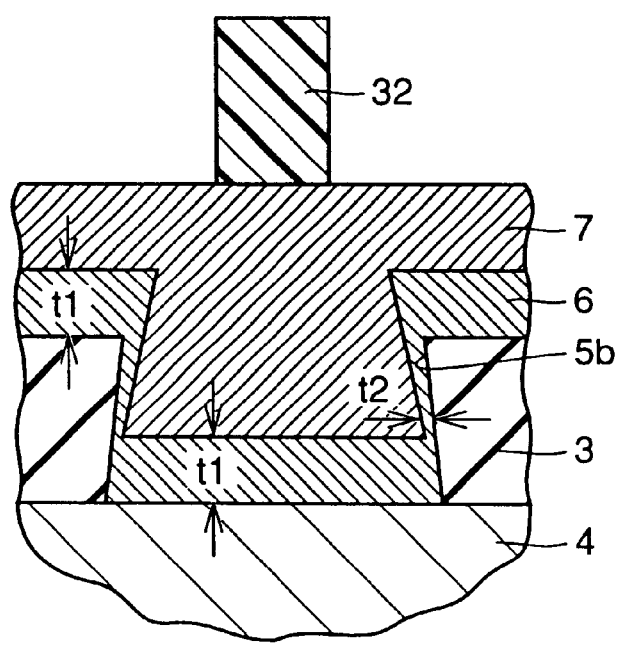

Next, referring to FIG. 8, a titanium (Ti) film of about 10 nm thick and a titanium nitride (TiN) film of about 70 nm thick are successively deposited, by sputtering or CVD, on silicon oxide film 3 to cover the side and bottom surfaces of hole 5b, so that a barrier metal 6 is formed.

At this time, the upwardly tapering cross section of hole 5b makes formation of barrier metal 6 on the side surface of hole 5b difficult. In this case, assuming that film thickness $t_1$ of barrier metal 6 on the upper surface of silicon oxide film 3 and on the bottom surface of hole 5b becomes approximately 80 nm, film thickness $t_2$ on the side surface of hole 5b becomes about 20 nm.

A metal film 7 including tungsten (W) of about 100 nm thick is then formed on barrier metal 6 by sputtering or CVD, and a resist pattern 32 is formed on metal film 7.

Figure 9:
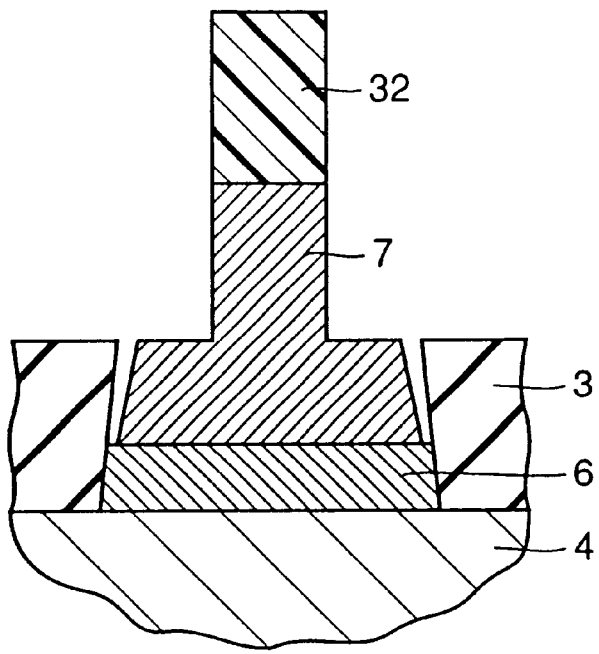

Next, referring to FIG. 9, metal film 7 is anisotropically etched using resist pattern 32 as a mask, under Condition A described in the first embodiment. Thus, the surface of barrier metal 6 located on the upper surface of silicon oxide film 3 is exposed.

Subsequently, the exposed barrier metal 6 is anisotropically etched under Condition B described in the first embodiment, to expose the upper surface of silicon oxide film 3. Resist pattern 32 is then removed. Thus, a metal interconnection 7a and a buried portion 7b are formed.

Figure 10:
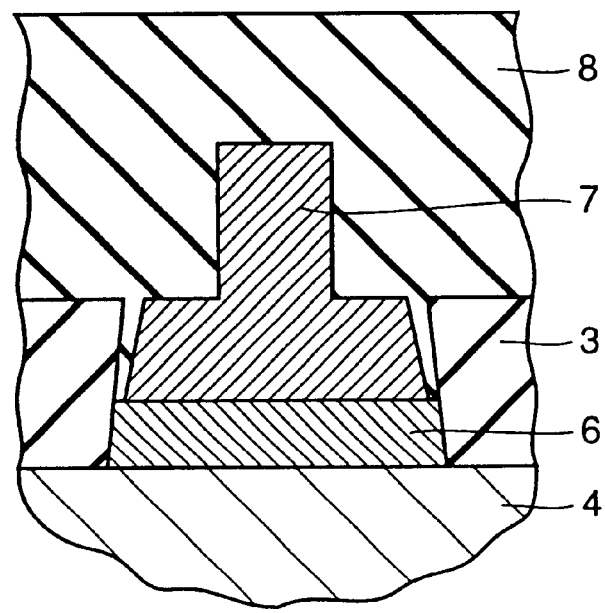

Next, referring to FIG. 10, a silicon oxide film 8 to be an interlayer insulating film is formed on silicon oxide film 3 to cover metal film 7. Accordingly, a main portion of the semiconductor device including metal interconnection 7a is completed.

In the manufacturing method of the semiconductor device described above, over-etching is performed at the step shown in FIG. 9 to remove the residue of barrier metal 6. At this time, as the film thickness of barrier metal 6 located between metal film 7 and the side surface of hole 5b is smaller than that on the bottom surface of hole 5b and on the upper surface of silicon oxide film 3, the etch rate of barrier metal G in the portion between metal film 7 and the side surface of hole 5b becomes smaller than that in the other portions because of the RIE-lag effect, as described in the first embodiment.

This prevents the exposure of the surface of polysilicon film 4 at the bottom of hole 5b due to the over-etching. As a result, even if a processing with $NH_4OH$ for removal of metal contamination or dust particles on silicon substrate 1 is performed, simultaneous etching of polysilicon plug 4 is avoided.

Accordingly, a semiconductor device ensuring an electrical connection between metal interconnection 7a and polysilicon plug 4 via buried portion 7b and barrier metal 6 is accomplished.

Third Embodiment

The manufacturing method of a semiconductor device according to the third embodiment of the present invention and the semiconductor device obtained by the mentioned method will now be described with reference to the drawings. First, in the step shown in FIG. 1, silicon oxide film 3 is formed to have a distance (film thickness) of about 200 nm from the upper surface of polysilicon plug 4 to the upper surface of silicon oxide film 3.

Figure 11:
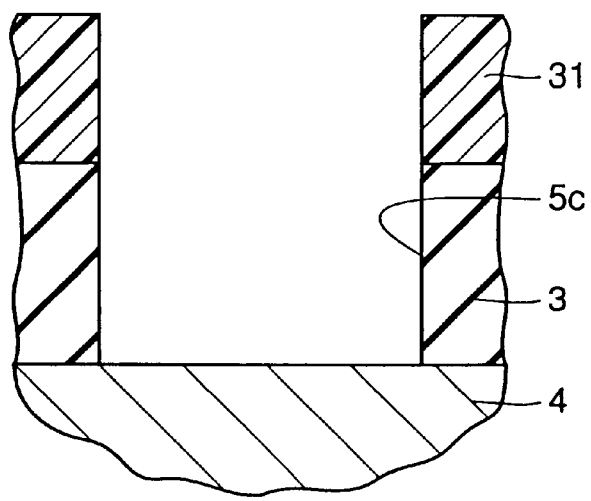
FIGS. 11 to 14 are cross sectional views illustrating successive steps of the manufacturing method of a semiconductor device according to a third embodiment of the present invention.

Next, referring to FIG. 11, a resist pattern 31 is formed on silicon oxide film 3. Using a parallel plate type RIE system or an ECR type etching system, silicon oxide film 3 is subjected to anisotropic etching with resist pattern 31 as a mask, under the conditions of: $C_4F_8$ flow rate of 0.01 L/min (10 sccm); CO flow rate of 0.05 L/min (50 sccm); $O_2$ flow rate of 0.01 L/min (10 sccm); Ar flow rate of 0.15 L/min (150 sccm); pressure of 1.995 Pa (15 mTorr); RF power of 140 W; and electrode temperature of −10° C. Thus, a hole 5c exposing the surface of polysilicon plug 4 is formed.

Figure 12:
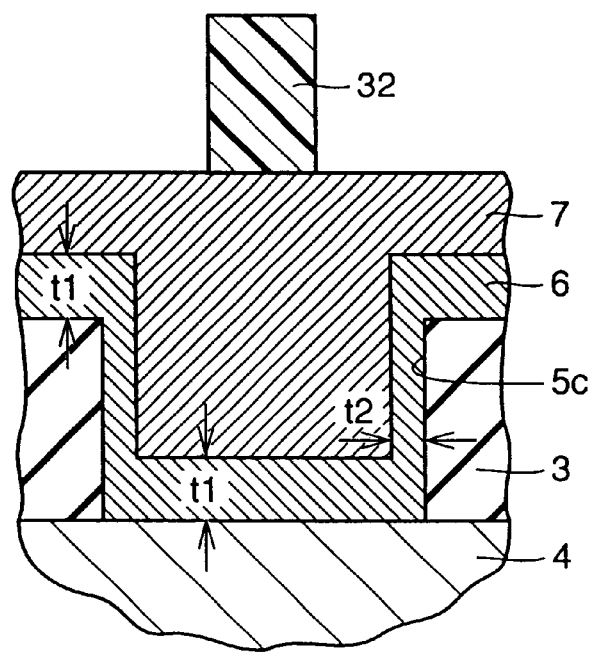

Next, referring to FIG. 12, a titanium (Ti) film of about 10 nm thick and a titanium nitride (TiN) film of about 70 nm thick are successively deposited by sputtering or CVD on silicon oxide film 3 to cover the side and bottom surfaces of hole 5c, so that a barrier metal 6 is formed.

At this time, the aspect ratio of hole 5c is made at least 0.75, so that less barrier metal 6 is formed on the side surface of hole 5c. In this case, assuming that film thickness $t_1$ of barrier metal 6 on the upper surface of silicon oxide film 3 and on the bottom surface of hole 5c is about 80 nm, film thickness $t_2$ on the side surface of hole 5c is about 40 nm.

On barrier metal 6, a metal film 7 is formed by sputtering or CVD, which includes tungsten (W) with a film thickness of about 100 nm. A resist pattern 32 is formed on metal film 7.

Figure 13:
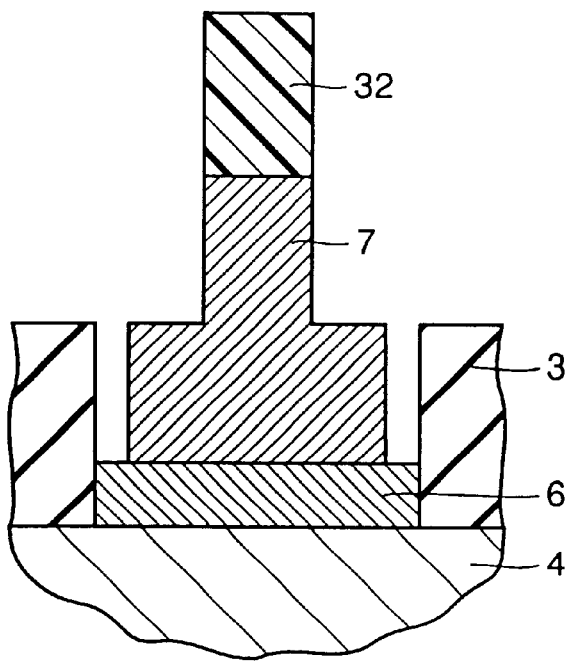

Next, referring to FIG. 13, metal film 7 is etched using resist pattern 32 as a mask, under Condition A described in the first embodiment, to expose barrier metal 6 located on the upper surface of silicon oxide film 3.

Subsequently, barrier metal 6 is subjected to anisotropic etching using resist pattern 32 as a mask, under Condition B described in the first embodiment, so that the upper surface of silicon oxide film 3 is exposed. Thereafter, resist pattern 32 is removed.

Figure 14:
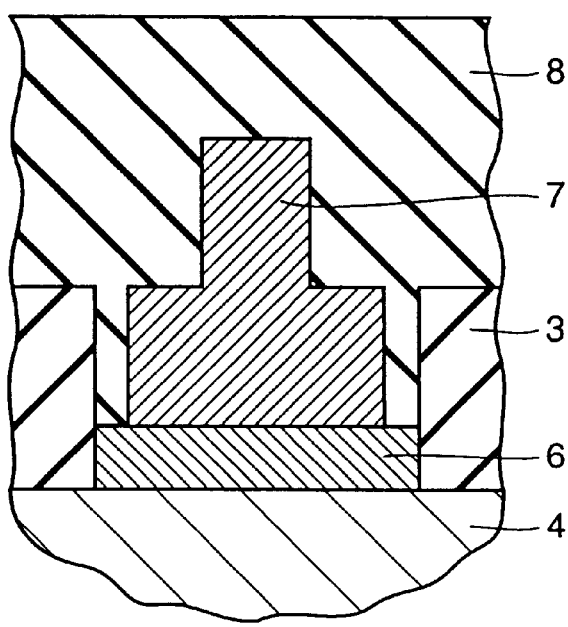

Next, referring to FIG. 14, a silicon oxide film 8 to be an interlayer insulating film is formed on silicon oxide film 3 to cover metal film 7. Thus, a main portion of the semiconductor device including metal interconnection 7a is completed.

In the manufacturing method of the semiconductor device described above, over-etching is conducted to remove the residue of barrier metal 6 at the step shown in FIG. 13. At this time, barrier metal 6 between the side surfaces of metal film 7 and of hole 5b is thinner than that on the bottom surface of hole 5b or on the upper surface of silicon oxide film 3. Therefore, the etch rate of barrier metal 6 in the narrow portion between the side surfaces of metal film 7 and of hole 5b becomes smaller than that in the other portions because of the RIE-lag effect.

Accordingly, the exposure of the surface of polysilicon film 4 at the bottom of hole 5b due to the over-etching is prevented. As a result, even if a processing for removal of metal contamination or dust particles on silicon substrate 1 is performed using $NH_4OH$, simultaneous etching of polysilicon plug 4 is avoided.

Thus, a semiconductor device is accomplished which ensures an electrical connection between metal interconnection 7a and polysilicon plug 4 via buried portion 7b and barrier metal 6.

Fourth Embodiment

Figure 15:
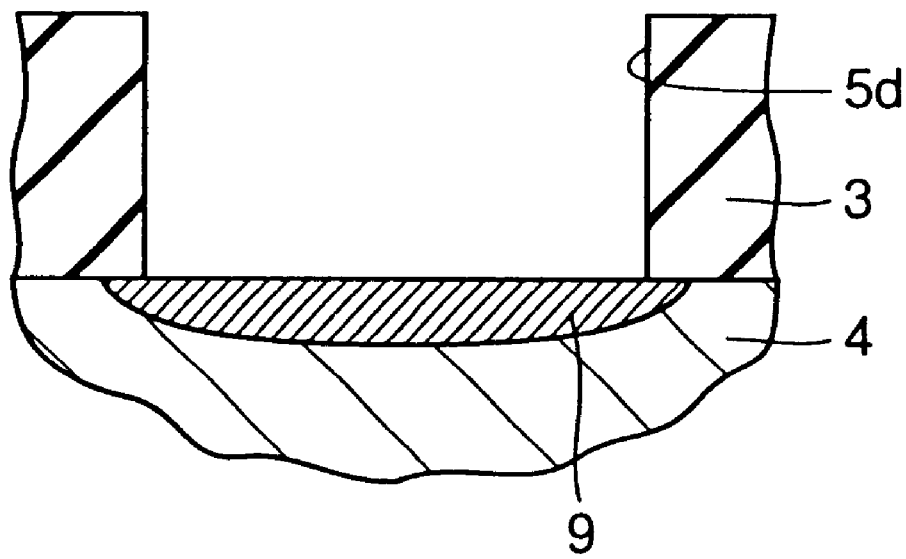
FIGS. 15 to 19 are cross sectional views illustrating successive steps of the manufacturing method of a semiconductor device according to a fourth embodiment of the present invention.

The manufacturing method of a semiconductor device according to the fourth embodiment of the present invention as well as the semiconductor device obtained by the method will now be described. First, referring to FIG. 15, a silicon oxide film 3 is formed on a silicon substrate (not shown) to cover polysilicon plug 4. A resist pattern (not shown) is formed on silicon oxide film 3.

Silicon oxide film 3 is subjected to anisotropic etching using the resist pattern as a mask, so that a hole 5d exposing the surface of polysilicon plug 4 is formed. A cobalt (Co) film is formed on silicon oxide film 3 by sputtering or the like to cover the bottom surface of hole 5d.

Next, a prescribed heat treatment is conducted to cause the silicon within polysilicon plug 4 to react with cobalt, so that a cobalt silicide film 9 is formed at the bottom of hole 5d. At this time, the silicon within silicon oxide film 3 does not react with cobalt. Thereafter, unreacted cobalt film is removed by a solution of mixed acids (of phosphoric acid, nitric acid and acetic acid). Cobalt silicide film 9 has a film thickness of about 60–70 nm.

Figure 16:
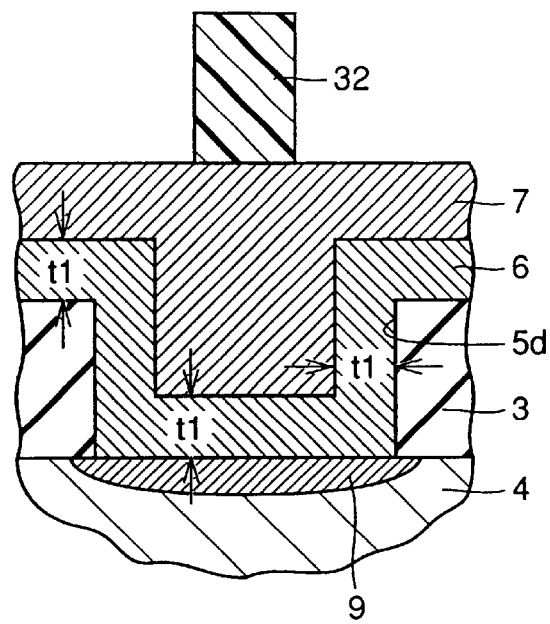

Next, referring to FIG. 16, a barrier metal 6 is formed on silicon oxide film 3 to cover the side and bottom surfaces of hole 5d, by sequentially depositing a titanium (Ti) film of about 10 nm thick and a titanium nitride (TiN) film of about 70 nm thick.

In this case, barrier metal 6 located on the upper surface of silicon oxide film 3 and barrier metal 6 located on the side and bottom surfaces of hole 5d have the equal film thickness of about 80 nm. A metal film 7 is then formed on barrier metal 6 by sputtering or CVD, which includes tungsten (W) of about 100 nm thick. A resist pattern 32 is formed on metal film 7.

Figure 17:
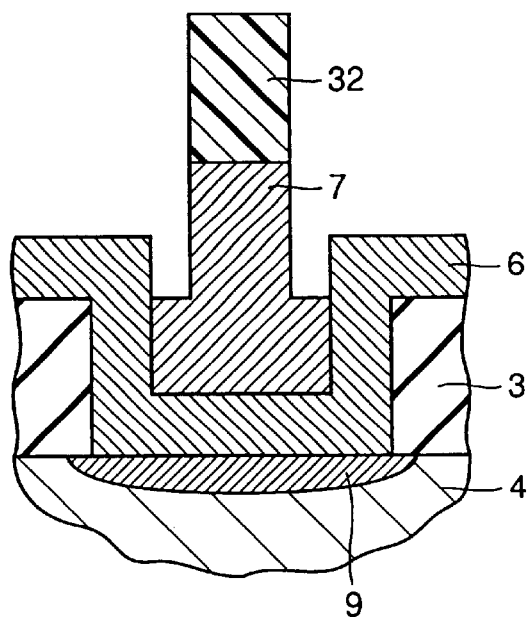

Next, referring to FIG. 17, metal film 7 is subjected to anisotropic etching using resist pattern 32 as a mask, under Condition A described in the first embodiment, so that the upper surface of barrier metal 6 is exposed. At this time, barrier metal 6 is hardly etched away.

Subsequently, with reference to FIG. 18, barrier metal 6 is subjected to anisotropic etching under Condition B described in the first embodiment, to expose the upper surface of silicon oxide film 3. Resist pattern 32 is then removed.

Figure 19:
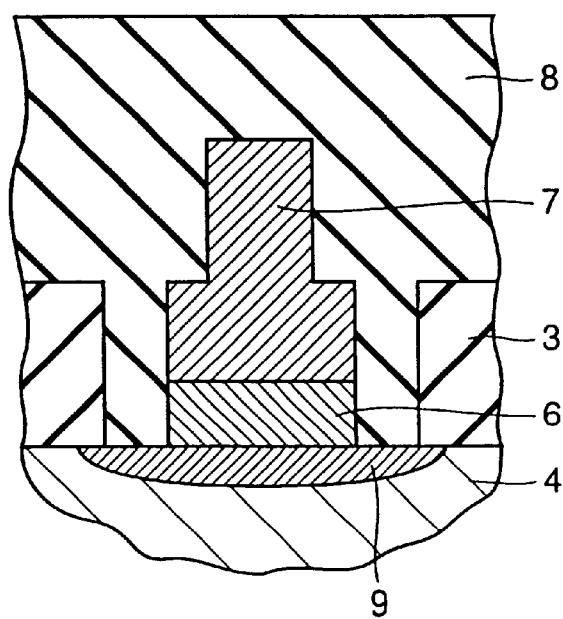

Next, referring to FIG. 19, a silicon oxide film 8 to be an interlayer insulating film is formed on silicon oxide film 3 to cover metal film 7. Thus, a main portion of the semiconductor device including the metal interconnection is completed.

Figure 18:
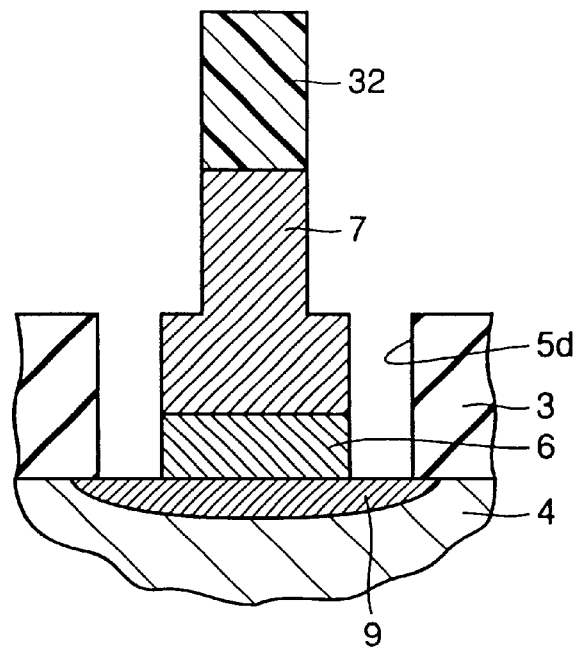

In the manufacturing method of the semiconductor device described above, over-etching is conducted at the step shown in FIG. 18 to remove the residue of barrier metal 6. At this time, even if the etching of barrier metal 6 located between the side surface of hole 5d and metal film 7 proceeds to expose the bottom surface of hole 5d, there exists cobalt silicide film 9 at the bottom of hole 5d, which has an etch rate different from that of polysilicon plug 4.

Therefore, even if a processing with $NH_4OH$ is conducted in a later step, cobalt silicide film 9 protects polysilicon plug 4, thereby preventing the surface of polysilicon plug 4 from being etched.

As a result, a semiconductor device is accomplished which ensures an electrical connection between metal interconnection 7a and polysilicon plug 4 via buried portion 7b and barrier metal 6.

Fifth Embodiment

Figure 20:
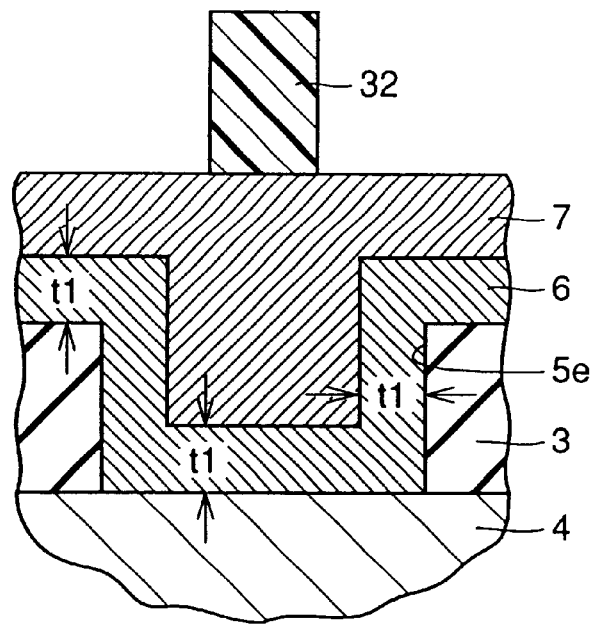
FIGS. 20 to 23 are cross sectional views illustrating successive steps of the manufacturing method of a semiconductor device according to a fifth embodiment of the present invention.

The manufacturing method of a semiconductor device according to the fifth embodiment of the present invention and the semiconductor device obtained by the same method will now be described. First, with reference to FIG. 20, a barrier metal 6 and a metal film 7 are formed without forming a cobalt silicide film 9 as in the step shown in FIG. 15 in the fourth embodiment. A resist pattern 32 is then formed on metal film 7.

Figure 21:
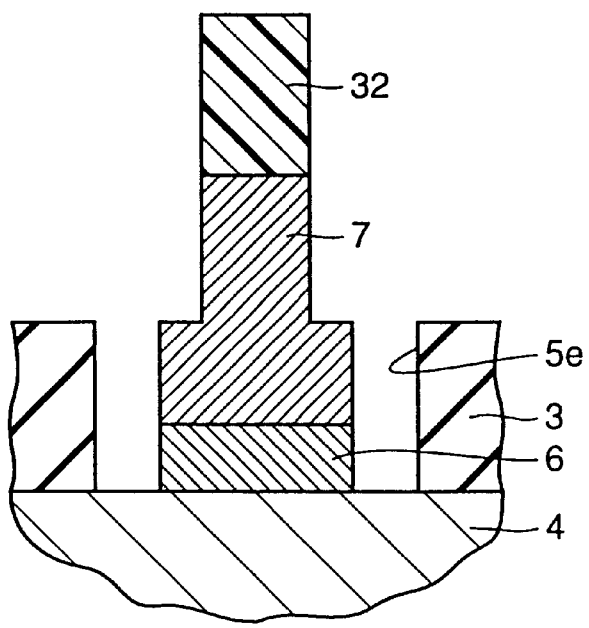

Next, with reference to FIG. 21, metal film 7 is subjected to anisotropic etching using resist pattern 32 as a mask, under Condition A described in the first embodiment, to expose the upper surface of barrier metal 6 located on the upper surface of silicon oxide film 3.

Subsequently, barrier metal 6 is subjected to anisotropic etching under Condition B described in the first embodiment, so that the upper surface of silicon oxide film 3 is exposed.

Figure 22:
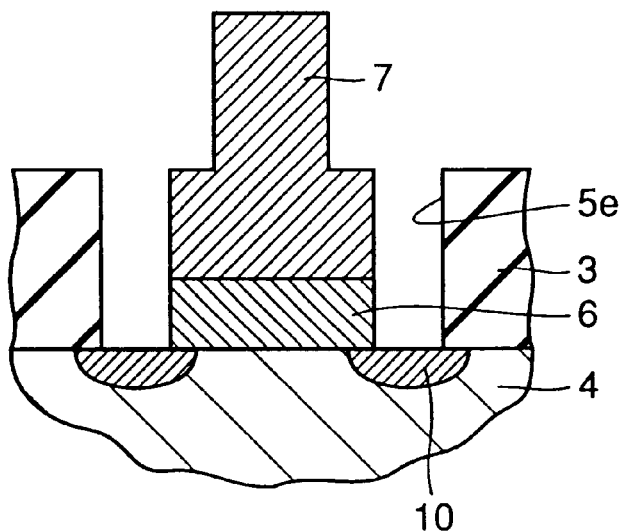

Next, with reference to FIG. 22, the silicon substrate is processed with oxygen plasma under the conditions of: $O_2$ flow rate of 8 L/min (8000 sccm); $N_2$ flow rate of 1 L/min (1000 sccm); pressure of 0.023 Pa (3.0 Torr); RF power of 1300 W; and electrode temperature of 200° C., to remove resist pattern 32.

Figure 23:
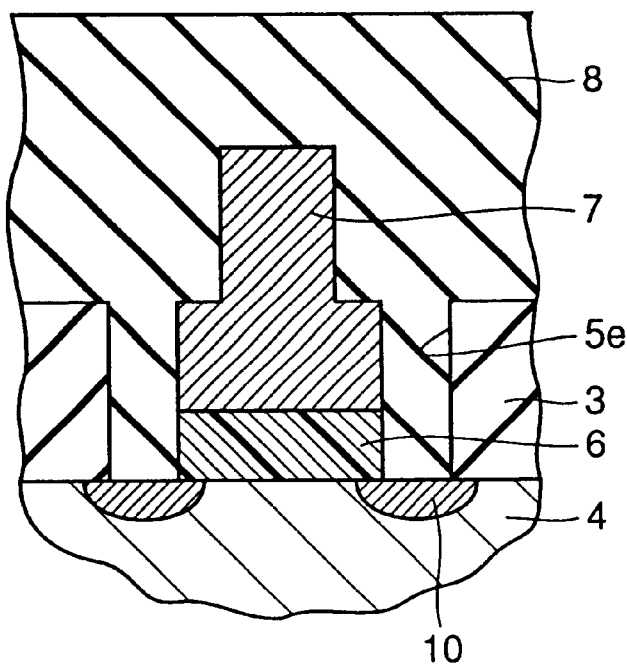

Next, with reference to FIG. 23, a silicon oxide film 8 to be an interlayer insulating film is formed on silicon oxide film 3 to cover metal film 7. Thus, a main portion of the semiconductor device including the metal interconnection is completed.

In the manufacturing method of the semiconductor device described above, over-etching is conducted at the step shown in FIG. 21 to remove the residue of barrier metal 6. At this time, even if the surface of polysilicon plug 4 located at the bottom of hole 5a is exposed due to the over-etching, a silicon oxide layer 10 is formed on the surface of the exposed polysilicon plug 4 by the oxygen plasma processing at the step shown in FIG. 22.

This silicon oxide layer 10 has a film thickness of about 5 nm. The formation of silicon oxide layer 10 prevents polysilicon plug 4 from being etched even if a processing with $NH_4OH$ is conducted in a later step. As a result, a semiconductor device is achieved which ensures an electrical connection of metal interconnection 7a and polysilicon plug 4 via buried portion 7b and barrier metal 6.

Sixth Embodiment

Figure 24:
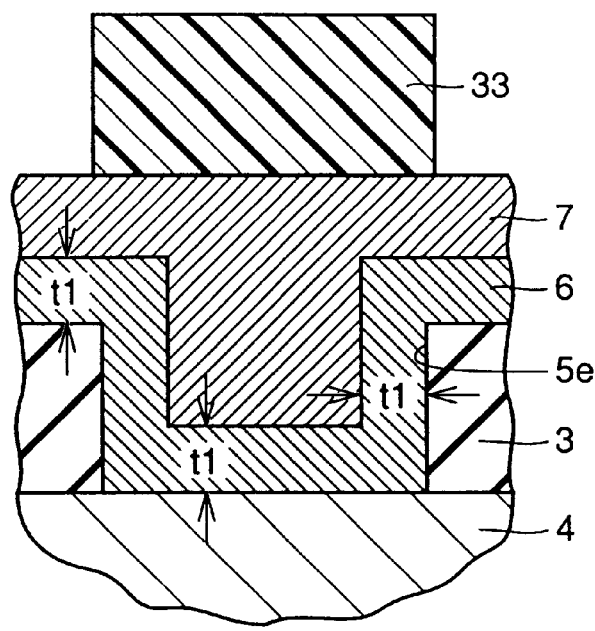
FIGS. 24 to 27 are cross sectional views illustrating successive steps of the manufacturing method of a semiconductor device according to a sixth embodiment of the present invention.
Figure 25:
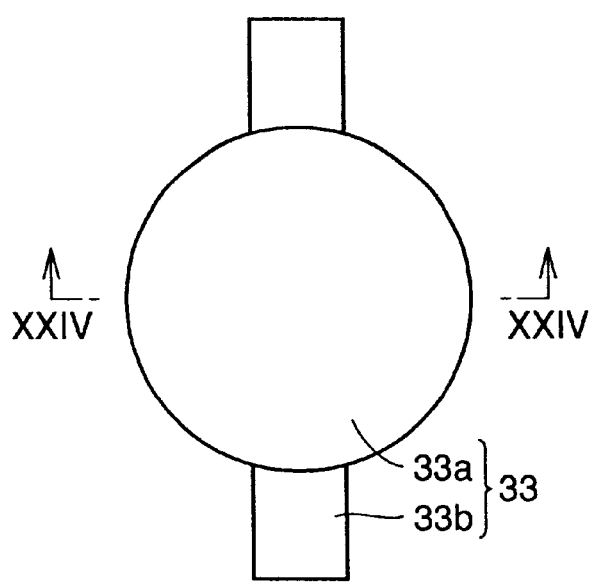

The manufacturing method of a semiconductor device according to the sixth embodiment of the present invention and the semiconductor device obtained by the same method will now be described. First, with reference to FIG. 24, a resist pattern 33 is formed, instead of resist pattern 32 formed at the step shown in FIG. 20 described in the fifth embodiment. Resist pattern 33 includes, as shown in FIG. 25, a portion 33a that entirely covers the open end of hole 5e, and a portion 33b for formation of an interconnection layer.

Figure 26:
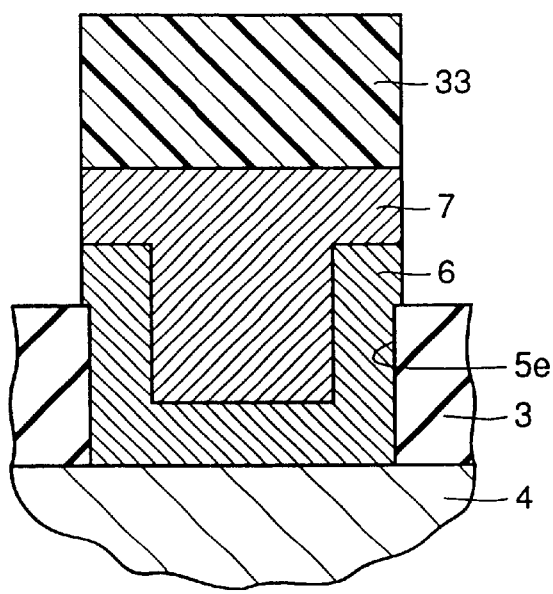

Next, with reference to FIG. 26, metal film 7 is subjected to anisotropic etching using resist pattern 33 as a mask, under Condition A described in the first embodiment. Thus, the upper surface of barrier metal 6 located on the upper surface of silicon oxide film 3 is exposed.

Subsequently, barrier metal 6 is anisotropically etched under Condition B described in the first embodiment, so that the upper surface of silicon oxide film 3 is exposed.

At this time, since resist pattern 33 is formed to cover the entire open end of hole 5e, barrier metal 6 located in the vicinity of the side surface of hole 5e is not etched away.

Figure 27:
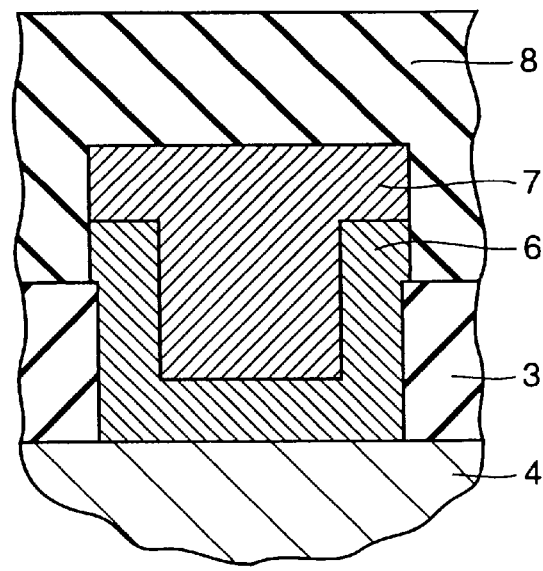

Next, with reference to FIG. 27, a silicon oxide film 8 to be an interlayer insulating film is formed on silicon oxide film 3 to cover metal film 7. Thus, a main portion of the semiconductor device including the metal interconnection is completed.

According to the manufacturing method of the semiconductor device described above, resist pattern 33 formed at the step shown in FIG. 26 entirely covers the open end of hole 5e. Therefore, barrier metal 6 located in the vicinity of the side surface of hole 5e is prevented from being etched away during the over-etching for removal of etch residue of barrier metal 6.

Thus, etching of polysilicon plug 4 is avoided even if a processing with $NH_4OH$ is conducted in a later step.

As a result, a semiconductor device ensuring an electrical connection between metal interconnection 7a and polysilicon plug 4 via buried portion 7b and barrier metal 6 is accomplished.

Seventh Embodiment

The manufacturing method of a semiconductor device according to the seventh embodiment and the semiconductor device obtained by the same method will now be described. In the sixth embodiment, resist pattern 33 is formed to entirely cover the open end of hole 5e at the step shown in FIG. 24.

Figure 28:
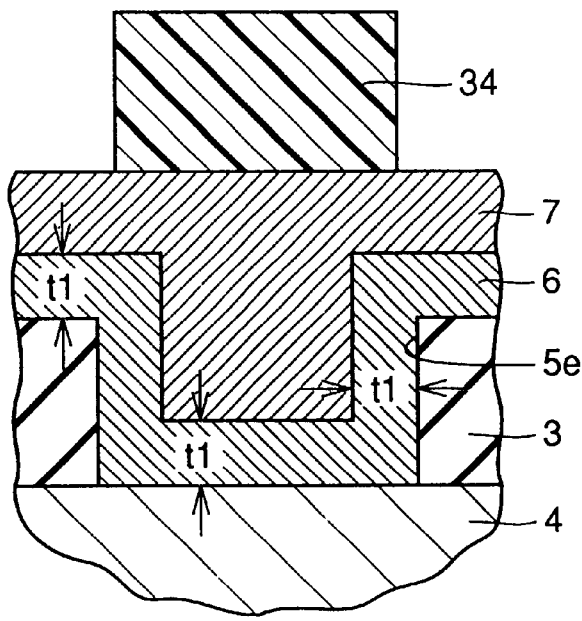
FIGS. 28 to 31 are cross sectional views illustrating successive steps of the manufacturing method of a semiconductor device according to a seventh embodiment of the present invention.

However, dimensional design constraints sometimes prevents formation of such a resist pattern. The present embodiment addresses such cases. First, as shown in FIG. 28, a resist pattern 34 is formed to cover the open end of hole 5e as much as possible. The radius of this resist pattern may be about 20 nm (0.02 μm) shorter than the radius of the hole.

Figure 29:
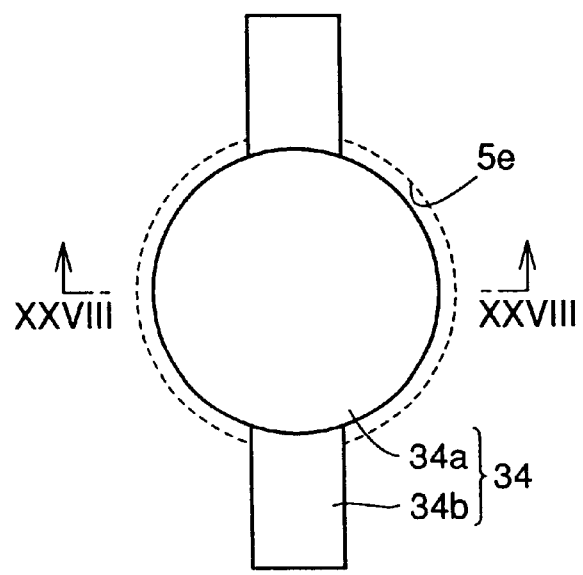

Specifically, as shown in FIG. 29, resist pattern 34 includes a portion 34a having a diameter smaller than the aperture of hole 5e to partly cover the open end of hole 5e, and a portion 34b for formation of an interconnection layer.

Figure 30:
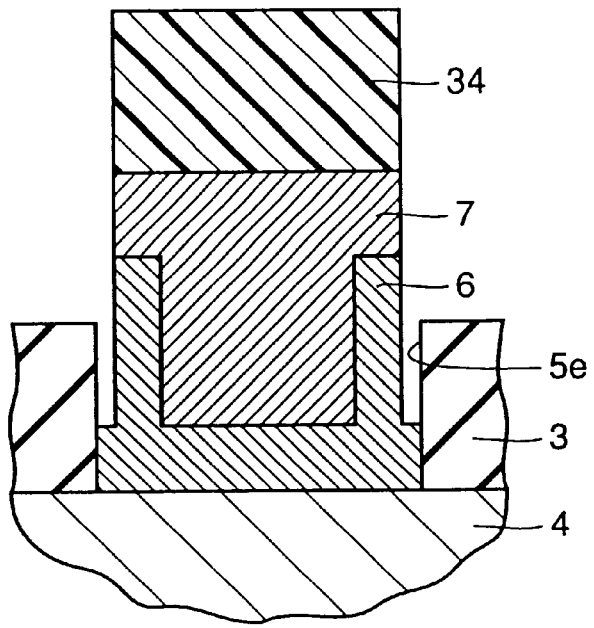

Next, with reference to FIG. 30, metal film 7 is subjected to anisotropic etching using resist pattern 34 as a mask, under Condition A described in the first embodiment, to expose the upper surface of barrier metal 6 located on the upper surface of silicon oxide film 3.

Subsequently, barrier metal 6 is anisotropically etched under Condition B described in the first embodiment, so that the upper surface of silicon oxide film 3 is exposed.

Figure 31:
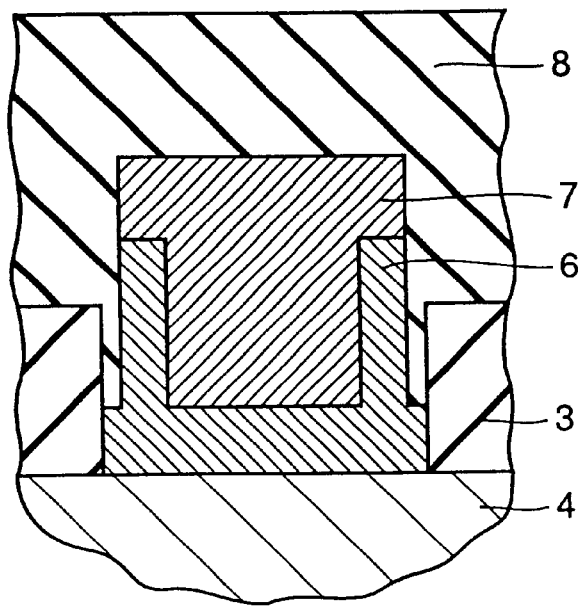
Figure 32:
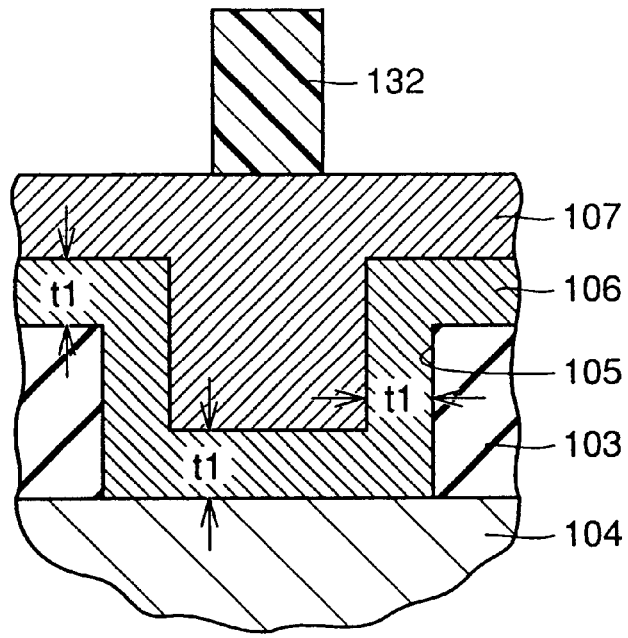
FIGS. 32 to 34 are cross sectional views illustrating successive steps of a conventional method of manufacturing a semiconductor device.
Figure 33:
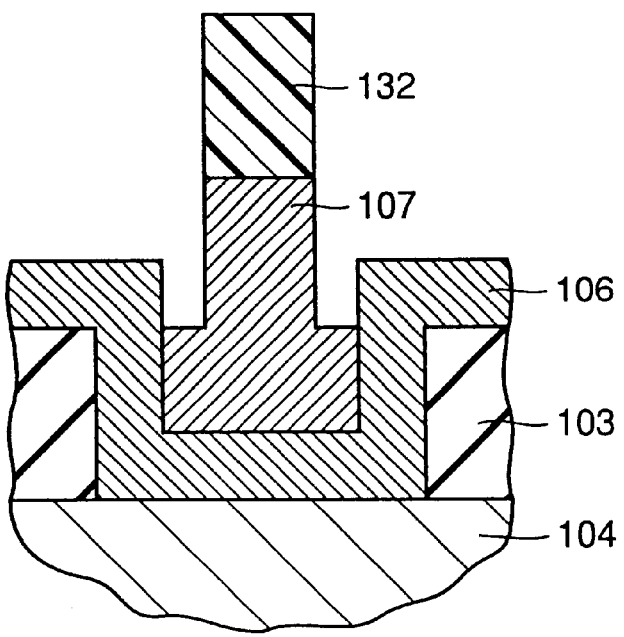
Figure 34:
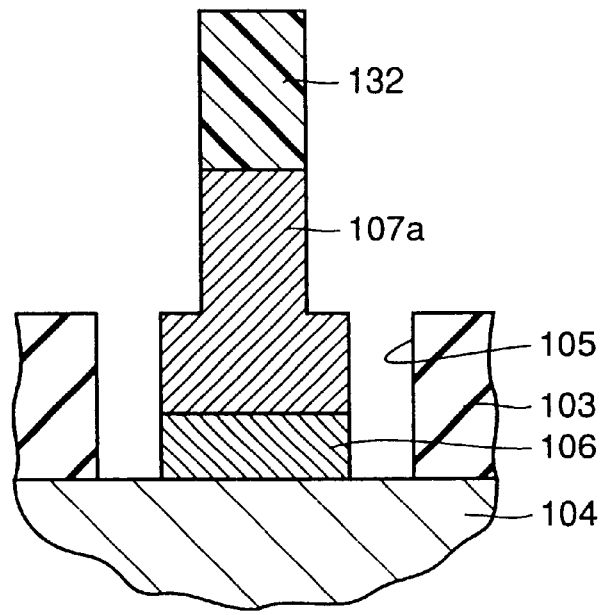
Figure 35:
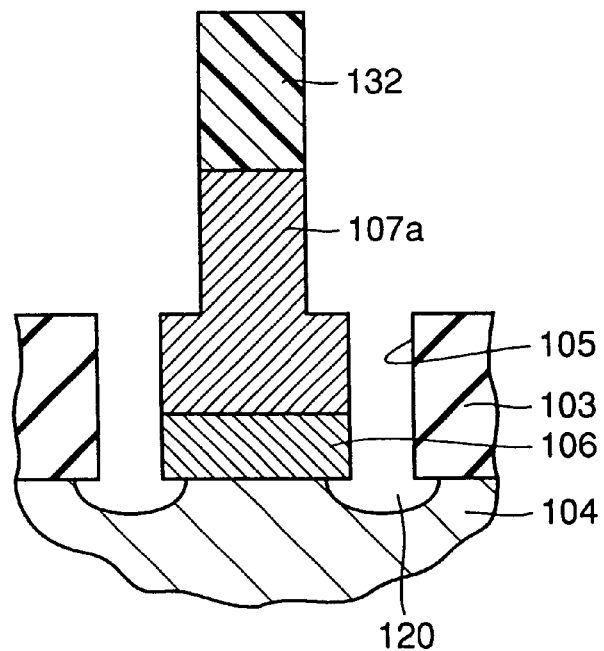
FIG. 35 is a cross sectional view illustrating a problem posed by the conventional method of manufacturing a semiconductor device.

Next, with reference to FIG. 31, a silicon oxide film 8 to be an interlayer insulating film is formed on silicon oxide film 3 to cover metal film 7. Thus, a main portion of the semiconductor device including the metal interconnection is completed.

According to the above-described manufacturing method, over-etching is conducted at the step shown in FIG. 30 to remove etch residue of barrier metal 6. At this time, barrier metal 6 located in the vicinity of the side surface of hole 5e is etched away because resist pattern 34 does not entirely cover the open end of hole 5e.

Here, the region of barrier metal 6 being etched away between the side surfaces of metal film 7 and hole 5b is narrow, so that the etch rate for this region becomes smaller than that for the other regions because of the RIE-lag effect as described above.

This prevents the surface of polysilicon film 4 at the bottom of hole 5b from being exposed due to the over-etching. As a result, even if a processing with NH$_4$OH is performed for removal of metal contamination or dust particles on silicon substrate 1, simultaneous etching of polysilicon plug 4 is avoided.

Accordingly, a semiconductor device ensuring an electrical connection between metal interconnection 7a and polysilicon plug 4 via buried portion 7b and barrier metal 6 is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    a semiconductor substrate having a main surface;
    a conductive region formed on said semiconductor substrate;
    an insulating film formed on said semiconductor substrate to cover said conductive region;
    a hole formed in said insulating film to expose a surface of said conductive region; and
    a conductive portion formed in said hole and electrically connected to said conductive region exposed at a bottom of said hole,
    said conductive portion having a portion spaced apart from a side surface of said hole at least in the vicinity of an open end of said hole, wherein a concave portion between the side surface of said hole and the portion of said conductive portion spaced apart from the side surface of said hole does not reach the surface of said conductive region exposed at the bottom of said hole.

2. The semiconductor device according to claim 1, wherein said hole has an open end narrower than an inner opening portion of said hole.

3. The semiconductor device according to claim 2, wherein said hole has a bowing or upwardly tapering cross section.

4. A semiconductor device comprising:
    a semiconductor substrate having a main surface;
    a conductive region formed on said semiconductor substrate;
    an insulating film formed on said semiconductor substrate to cover said conductive region;
    a hole formed in said insulating film to expose a surface of said conductive region; and
    a conductive portion formed in said hole and electrically connected to said conductive region exposed at a bottom of said hole,
    said conductive portion having a portion spaced apart from a side surface of said hole at least in the vicinity of an open end of said hole, wherein said conductive portion is spaced apart from the side surface of said hole from the open end down to the bottom of said hole, and
    a prescribed layer having an etch characteristic different from the etch characteristic of said conductive region is formed at the bottom surface of said hole located in said conductive region between said conductive portion and the side surface of said hole.

5. The semiconductor device according to claim 4, wherein said conductive region includes a polysilicon film, and
    said prescribed layer includes a metal silicide layer.

6. The semiconductor device according to claim 4, wherein said conductive region includes a polysilicon film, and
    said prescribed layer includes a silicon oxide film.

* * * * *